US008546928B2

(12) United States Patent
Merz et al.

(10) Patent No.: US 8,546,928 B2
(45) Date of Patent: Oct. 1, 2013

(54) MICROMECHANICAL HOUSING COMPRISING AT LEAST TWO CAVITIES HAVING DIFFERENT INTERNAL PRESSURE AND/OR DIFFERENT GAS COMPOSITIONS AND METHOD FOR THE PRODUCTION THEREOF (75) Inventors: Peter Merz, Beldorf (DE); Wolfgang Reinert, Neumunster (DE); Marten Oldsen, Hamburg (DE); Oliver Schwarzelbach, Itzehoe (DE)

(73) Assignee: Fraunhofer-Gesellschaft zur Foerderung der angewandten Forschung e. V., Munich (DE)

( * ) Notice: Subject to any disclaimer, the term of this patent is extended or adjusted under 35 U.S.C. 154(b) by 283 days.

(21) Appl. No.: 12/296,189

(22) PCT Filed: Apr. 4, 2007

(86) PCT No.: PCT/EP2007/053342
§ 371 (c)(1),
(2), (4) Date: Mar. 12, 2009

(87) PCT Pub. No.: WO2007/113325
PCT Pub. Date: Oct. 11, 2007

(65) Prior Publication Data
US 2010/0025845 A1 Feb. 4, 2010

(30) Foreign Application Priority Data
Apr. 6, 2006 (DE) .......................... 10 2006 016 260

(51) Int. Cl.
*H01L 23/20* (2006.01)
*H01L 27/14* (2006.01)

(52) U.S. Cl.
USPC ............ 257/682; 257/E23.002; 257/E23.137; 257/723; 438/56; 438/115; 438/143; 438/310; 438/471

(58) Field of Classification Search
USPC ................. 257/E21.318, E21.321; 438/402
See application file for complete search history.

(56) References Cited

U.S. PATENT DOCUMENTS

| 4,269,624 A | 5/1981 | Figini |
| 4,977,035 A | 12/1990 | Travis et al. |

(Continued)

FOREIGN PATENT DOCUMENTS

| EP | 0794558 A1 | 9/1997 |
| JP | 2002352700 A | 12/2002 |
| WO | 2005050751 A2 | 6/2005 |
| WO | 2005118463 A1 | 12/2005 |

OTHER PUBLICATIONS

P. Merz et al.; PSM-X2: Polysilicon Surface Micromachining Process Platform for Vacuum-Packaged Sensors; Konferenzband Mikrosystemtechnik-Kongress; 2005; pp. 467-470; VDE Verlag; Freiburg, Germany.

(Continued)

*Primary Examiner* — Julio J Maldonado
*Assistant Examiner* — Mohammad Choudhry
(74) *Attorney, Agent, or Firm* — Stevens & Showalter LLP (57) ABSTRACT The present application relates to a multiple component which is to be subsequently individualized by forming components containing active structures, in addition to a corresponding component which can be used in microsystem technology systems. The multiple component and/or component comprises a flat substrate and also a flat cap structure which are bound to each other such that they surround at least one first and one second cavity per component, which are sealed against each other and towards the outside. The first of the two cavities is provided with getter material and due to the getter material has a different internal pressure and/or a different gas composition than the second cavity. The present application also relates to a method for producing the type of component and/or components for which gas mixtures of various types of gas have a different absorption ratio in relation to the getter material.

36 Claims, 3 Drawing Sheets

(56) References Cited

U.S. PATENT DOCUMENTS

| | | | |
|---|---|---|---|
| 5,320,496 | A | 6/1994 | Manini et al. |
| 5,668,033 | A | 9/1997 | Ohara et al. |
| 6,236,156 | B1 | 5/2001 | Ito |
| 2002/0051258 | A1 | 5/2002 | Tamura |
| 2002/0180032 | A1* | 12/2002 | Sun et al. ............... 257/704 |
| 2004/0077117 | A1* | 4/2004 | Ding et al. ............... 438/51 |
| 2004/0183214 | A1 | 9/2004 | Partridge et al. |
| 2005/0023629 | A1 | 2/2005 | Ding et al. |
| 2005/0074919 | A1* | 4/2005 | Patel et al. ............... 438/107 |
| 2005/0208739 | A1 | 9/2005 | Curtis et al. |
| 2005/0253283 | A1* | 11/2005 | DCamp et al. ............ 257/787 |

OTHER PUBLICATIONS

R.F. Wolffenbuttel et al.; Low-temperature Silicon wafer-to-wafer Bonding Using Gold at Eutectic Temperature; Sensors and Actuators A, 43; 1994; pp. 223-229.

M. Moraja et al.; New Getter Configuration at Wafer Level for Assuring Long Term Stability of MEMS; Reliability, Testing and Characterization of MEMS/MOEMS II; Proc. of SPIE, vol. 4980; 2003; pp. 260-267.

D. Sparks et al.; Reliable Vacuum Packaging Using NanoGetters and Glass Frit Bonding; Reliability, Testing and Characterization of MEMS/MOEMS III; Proc. of SPIE, vol. 5343; Jan. 2004; pp. 70-78.

M. Moraja et al.; Chemical Treatment of Getter Films on Wafers Prior to Vacuum Packaging; Reliability, Testing and Characterization of MEMS/MOEMS III; Proc. of SPIE, vol. 5343; 2004; pp. 87-93.

Najafi, Khalil; Micropackaging Technologies for Integrated Microsystems: Applications to MEMS and MOEMS; Micropackaging and Microfabrication Process Technology VIII; Proceedings of SPIE; vol. 4979; pp. 1-19; 2003.

\* cited by examiner

MICROMECHANICAL HOUSING COMPRISING AT LEAST TWO CAVITIES HAVING DIFFERENT INTERNAL PRESSURE AND/OR DIFFERENT GAS COMPOSITIONS AND METHOD FOR THE PRODUCTION THEREOF

BACKGROUND OF THE INVENTION

1. Field of the Invention

This invention relates to a method for the combined and preferably wafer-based housing of micromechanical systems comprising individually different operating pressures. Using a single operation, this method enables to selectively fill one cavity 1 with defined gas pressure P1 and one cavity 2 with gas pressure P2, in which P1 and P2 can be chosen independently. This method allows to combine different micromechanical systems into one component. The degree of integration of these systems is therefore increased substantially. In addition, this invention relates to micromechanical systems comprising at least two cavities and different internal pressures and/or different gas compositions in each cavity.

2. Description of Related Art

For quite some time, components produced by microsystem technology (micro electro-mechanical systems, MEMS) have allowed the miniaturized and cost-effective production of sensors and actuators. Microsystem technology (MST) is a rather new branch of technology which employs the silicon-based and highly effective production processes used in semiconductor industries in order to transfer macroscopic technology systems into microscopic structures. This supports the continued miniaturization and performance enhancement of technical products. MST products are used in many industries, such as microelectronics, industrial automation, communication technology, medical technology, within the automobile industries and for life science products. Advances in miniaturization and the continued increase in integration density of microsystems necessitate the ongoing development and improvements of existing production methods.

The automobile industry and engineering need complex, integrated microsystems components in order to perform a multitude of measuring and controlling functions, autonomously and with a minimum of energy. Depending on their requirements, different sensor systems need different operating pressures. Resonant systems frequently require high performance implementation. Any mechanical damping through ambient gas in the cavity in which the sensor system is placed thus needs to be minimized by keeping the cavity operating pressure low. For example, resonant rotary rate sensors are typically operated at pressures of one µbar to a few mbar.

On the other hand, accelerometers have to be damped strongly and their operating pressure is typically at a few hundred mbar. The following table shows the typical operating pressure of different microsystems:

| Sensor/Component Type | Operating Pressure |
| --- | --- |
| Accelerometer | 300-700 mbar |
| Absolute pressure sensor | 1-10 mbar |
| Resonant sensor (e.g., rotary rate sensor) | 0.1 mbar |
| Bolometer | <0.0001 mbar |
| RF Switch | <0.0001 mbar |

Figure 2:
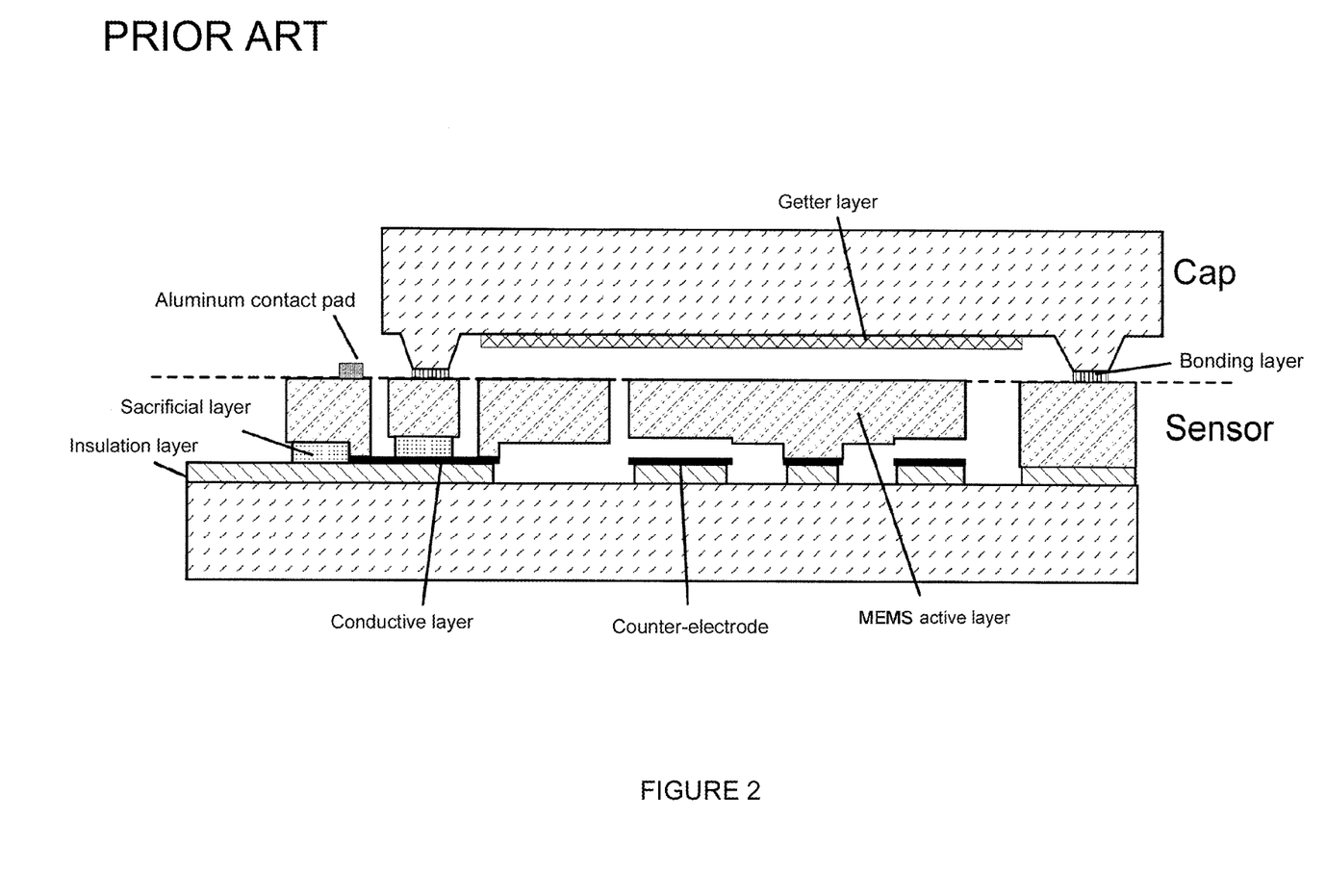
FIG. 2 shows a typical assembly of a resonant inertial sensor produced using microsystem technology.

FIG. 2 shows the typical assembly of a resonant inertial sensor produced using microsystem technology (P. Merz, W. Reinert, K. Reimer, B. Wagner, 'PSM-X2: *Polysilicon surface micromachining process platform for vacuum-packaged sensors*, Konferenzband Mikrosystemtechnik-Kongress 2005, D/Freiburg, VDE Verlag, p. 467-470). The micromechanical bottom surface sensor contains the active sensor structure (MEMS active layer). Free standing structures are formed through a specific etch process which removes a sacrificial layer. Out-of-plane movements are detected capacitively by mounting counter-electrodes at a distance of 1.5 µm. Therefore, the direction of movement of micromechanical systems is not limited to in-plane movements, out-of-plane movements can also be generated and detected. Inside the upper chip (the cap), a 60 µm deep cavity contains getter material used to absorb and chemically bind gas molecules. The solid bonding of sensor and cap wafer is accomplished at the wafer level through a gold-silicon eutectic (so-called Wafer-Level-Packaging). The bonding frame of gold-silicon provides a hermetic seal which retains the pressure set during the eutectic bonding procedure. The getter layer deposited into the cavity ensures that a minimal cavity pressure of as low as 1E-6 bar can be set and maintained throughout the life of the component.

The housing of micro-sensors is one of the least developed yet one of the most important and most challenging technology fields within the art of microsystem technology. A key technology for many micromechanical components is the provision of a hermetic housing. A hermetically sealed encapsulation protects micro-sensors against harmful environmental agents (dust, mechanical and chemical damages) and prolongs the reliable function and life of the sensor. In addition, modern resonant operated micro-sensors require a specific operating gas or a defined ambient pressure within the housing cavity in order to function properly.

The so-called Wafer-Level-Packaging (WLP) enables the encapsulation of open sensors at the wafer level. This is accomplished by providing a cap wafer containing the individual functional elements of the housing. The cap wafer is assembled with the sensor wafer such that each sensor chip is solidly bounded to a housing chip. Only after this assembly at the wafer level is the wafer pair then individualized into single chips. Through its massively parallel production, the housing at the wafer level provides enormous advantages with respect to costs, component integration density and yield compared to housing at the chip level.

A number of well established methods are available for use in WLP technology, such as glass frit bonding, anodized wafer bonding, direct bonding (fusion bonding), eutectic bonding, thermo-compression bonding, adhesive bonding or gluing (see R. F. Wolffenbuttel, K. D. Wise, '*Low-temperature silicon-to-wafer bonding using gold at eutectit temperature*', Sensors and Actuators A, 43, 1994, p. 223-229; M. Madou, '*Fundamentals of Microfabrication*', CRC Press, Boca Raton, 2002).

Using housing at the wafer level, the production chamber gas and the production pressure are sealed within the cavity. This allows production uniformity in that all components of the wafer can receive an identical cavity pressure. The cavity can be provisioned with atmospheric pressure, subatmospheric pressure and can be overpressurized. Typically, the WLP technology described above can achieve minimal cavity pressures of between 1-10 mbar. Operating pressures below that are normally not achievable. A remaining partial pressure in the range of 1 to 10 mbar will be present through outgassing of materials, surface desorption of molecules and the decomposition of contamination particles.

In order to achieve even lower pressures of less than 1 mbar, additional functional layers called getter layers need to be used which will absorb specific gas molecules (see M. Moraja, M. Amiotti, R. C. Kullberg, 'New getter configuration at wafer level for assuring long term stability of MEMS', Proc. of SPIE, Vol. 4980., 2003, p. 260-267; D. Sparks, S. Massoud-Ansari, N. Najafi, 'Reliable vacuum packaging using Nanogetters™ and glass frit bonding', Reliability, Testing and Characterisation of MEMS/MOEMS III, Proc. of SPIE, Vol. 5343, 2004, p. 70-78). This can be accomplished through surface adsorption, through volume solubility or through chemical bonding.

A large number of getter materials have been developed within the last few decades. Among those that have been used for quite some time are getters made from metals or alloys such as Ba, Al, Ti, Zr, V, Fe and similar. These have found application in cathode ray tubes, flat screens, particle accelerators and in semiconductor production equipment, for examples see U.S. Pat. Nos. 4,269,624, 5,320,496, 4,977,035 or 6,236,156. These materials absorb or adsorb different gases either through simple surface adsorption or through oxide and hydride formation. So-called non-evaporable getters (NEGs) have been used since the middle of the 1990s, either as tablets or as strips in specially designated recesses or in a ceramic encapsulation in the vicinity of the chip. NEGs have been produced frequently using the methods of powder metallurgy in order to keep the surface area as large as possible. With these methods, the sintering of metal particles is barely initiated so that small gaps remain between the metal pellets. By applying a temperature activation process in vacuum or in a reducing hydrogen atmosphere, the surface oxidation layer which formed during the sintering process is removed. Then, the activation process is completed either by continued heating of the surrounding structure or by electric resistance heating (using an Ohm heater element).

BRIEF SUMMARY OF THE INVENTION

Figure 1:
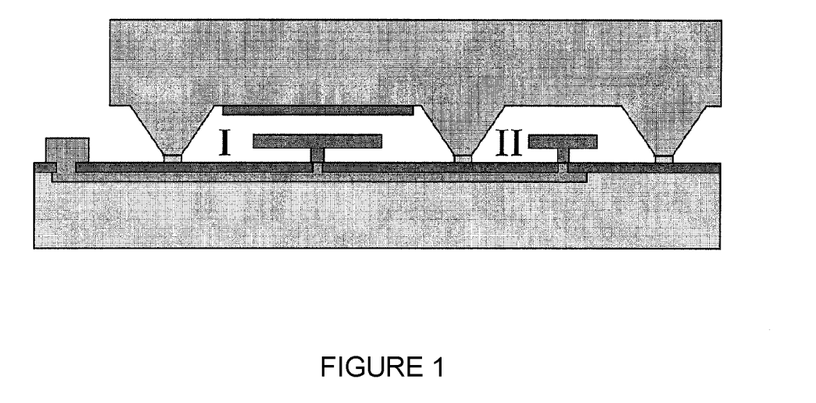
FIG. 1 illustrates a structure in accordance with the present invention having two cavities.

The objective of this invention is to provide components intended for use in microsystem technology (MEMS) (e.g., chips) having at least two cavities or voids (I and II in FIG. 1) with gas volumes comprising of different gas pressures and/or different gas compositions. This invention also provides multiple component systems (e.g., wafers) comprising of a substrate and a cap structure which can be used to subsequently produce said components through individualization (cutting or other means). Finally, this invention provides methods for the production of said components and of said multiple component systems which can be used to produce the components.

DETAILED DESCRIPTION OF THE INVENTION

This objective is met in that one first of two (MEMS) component cavities is provided with one (first) getter material, and in that the bonding of substrate and cap is performed in a gas atmosphere having at least one gas type which can be absorbed by the first getter material thus that, after the activation of the getter material, the first of the two cavities maintains a different internal pressure and/or a different gas composition compared to a second cavity due to the absorption characteristics of the getter material with respect to this gas type. Preferably, the gas atmosphere is composed of two gas types A and B with different absorption characteristics for the (first) getter material. The second cavity either does not contain any getter material, or it contains a second getter material with different absorption characteristics, or it contains the first or a second getter material in quantities that, after the activation of the getter material, induce a different ratio of both gas types in this second cavity compared to the first cavity.

Figure 3:
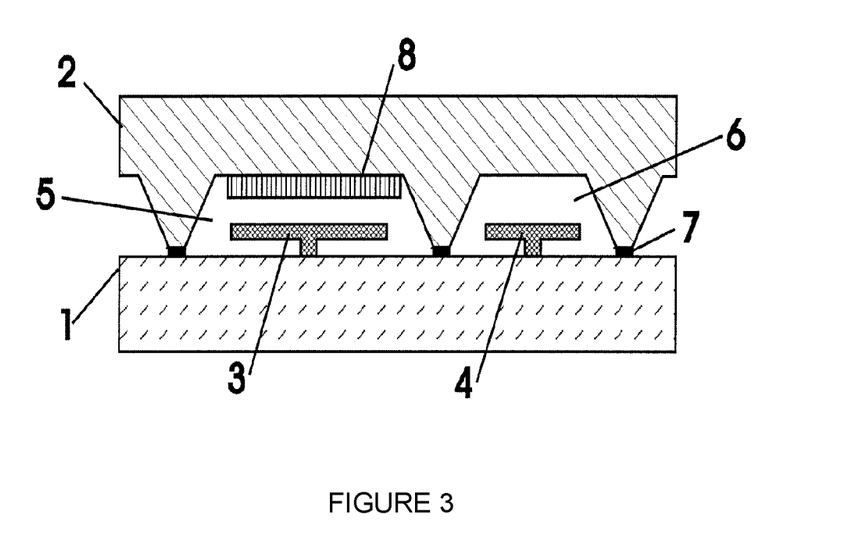
FIG. 3 shows the construction of a sensor system having two submodules which are hermetically separated from each other.

For the simultaneous housing of a plurality or multiplicity of Microsystems containing active structures, for example sensor systems, with different operating pressures and at the wafer or similar level, a corresponding wafer or similar component is provided, containing corresponding active structures, for example, a wafer with one or typically several sensors to be housed. In a typical example, FIG. 3 shows the construction of a sensor system having two submodules which are hermetically separated from each other. Micromechanical sensor subsystems 3 and 4 are located on a sensor wafer 1, the surface of which is essentially flat. Additionally provided is a cover, for example one cap wafer 2, having depressions or recesses corresponding to the sensor areas such that cavities are established, and being solidly connected with sensor wafer 1 through a bonding process. Bonding frame 7 encloses the sensor areas and seals these hermetically against the outside. It is obvious that the arrangement of active structures and of the cavities can differ from the arrangement shown in this Figure. As an example, the active structures, for example sensors, may be located in recesses within the sensor wafer with the cap wafer having a flat surface or minimum recesses, depending on the space requirements of the active structures. In a different embodiment, the active structure may also be located in the cap wafer such that the variants described above would be realized as a mirror image of the embodiment.

The production gas atmosphere, either defined by the bonding process or suitably selected for the objective of this invention, is encapsulated into the cavities or recesses when both wafers have been connected. The production gas atmosphere consists of at least one gas type A. On activating the first getter material within the first cavity, and depending on the amount of the getter material, this gas type will be at a minimum partially absorbed or will be completely absorbed or will be essentially completely absorbed, and a (partial) vacuum is created within this cavity. Preferably, the production gas atmosphere will consist of a minimum of two gas types A and B with different reaction characteristics for the first getter material.

As used in the present application, "gas type" may be used to refer to a single gas or a mixture of gases. In the first case, the single gas (for example, A) exhibits at least one characteristic with respect to the absorption by the getter material in use which differs from a corresponding characteristic of a different gas type (for example, B). In the second case, the components of the mixture of gases exhibit preferably all characteristics or at least one characteristic with respect to the absorption by the getter material in use which differs from a corresponding characteristic of one different gas type (for example, B). Therefore, gas type A, for example, may be a mixture of gases of similar or different reactivity which can be absorbed by the getter material in use, while gas type B, for example, may be composed of one or a mixture of noble gases which cannot be absorbed by getter materials.

Again referring to FIG. 3 and as indicated above, either the cap wafer or the wafer containing the active structure exhibit a recess such that both wafers can be bonded together forming cavities. For each corresponding microsystem component, at least two cavities 5, 6 are provided, however, more cavities can be provided depending on requirements. Preferably within the interior of the cap wafer, in the region of the cavity, a getter material 8 is located such that after completion of the bonding the getter material is only located in the first of the at least two cavities 5, 6. The getter material in the first cavity 5 can absorb molecules of a first gas type A (for example, $H_2$, $O_2$, $CO_2$ or $N_2$ or any mixture of these gases). The getter material normally will not react with molecules of a second gas type B (for example, inert gases such as Ar or Ne). As is known as the state of the art and as discussed above, the getter material will typically be deposited within the cap wafer in an inactive state. The activation of the getter material is typically accomplished through a temperature-time-process, as is known in the state of the art and as is discussed in more detail below. After this activation, molecules of type A will have been gettered (absorbed). After the activation of the getter material, the gases of type A in cavity 5 are absorbed such that the cavity pressure is defined through the remaining molecules of type B.

The original cavity pressure defined as the sum (of the partial pressures) of particles of type A and B remains in the second cavities without getter material. According to this invention, the remaining pressure in each of the different subsystems can be determined via the composition of the original gas mixture (A+B) and the amount and type of getter material in at least the first cavities, which must be chosen to be different from the amount and/or type of getter material in the second cavities (inasmuch any getter material is located there at all). It should be obvious that the partial pressure of gas type B can be zero. In this case, the gas mixture is composed of only one gas type, A.

In a first embodiment of this invention, getter material is brought into the cap of the first cavities in such quantities that after the getter activation, the particles of gas type A have been completely or essentially completely absorbed. Therefore, first cavities 5 will have only (or essentially only) particles of gas type B (or, if the partial pressure of B is zero or almost zero, cavities 5 will have more or less an almost absolute vacuum), while all gas molecules of type A and, if applicable, type B remain in the gas volume of second cavities 6.

In an alternate embodiment of this invention, getter material is brought into first cavities 5 in quantities which are not sufficient to completely absorb gas type A, but which will only absorb a fraction of x mol percent (mol-%). After activation of the getter, the gas atmospheres within the cavities are different such that—due to the reduced amount of getter material and the resulting incomplete gas absorption—the first cavities contain (100−x) mol-% of type A plus the total amount of type B, while the gas mixture within the second cavities remains unchanged. This procedure allows adjusting arbitrary pressure ranges.

In yet another embodiment of this invention, the MEMS component (for example, a chip) has two or more cavities 5, 6, with getter material in both cavities or, if there are more than two cavities per component, in at least two of the component cavities. In these cases, the area of the getter material and/or its gas absorption characteristics in both cavities are different such that both or at least two cavities have different end pressures and/or gas compositions after getter activation.

The getter material can be placed into the cavity in any preferred arrangement, for example, as strips or as a surface area or as a structured shape. Preferably, it will be placed onto the cap of the wafer or the like, for example, within its recesses if these exist. Alternatively, the getter material may also be placed on the side of the substrate, for example, to the side of the active structures or even below these structures, if these areas are not needed otherwise.

For components to be produced with more than two cavities, the gas mixture may be composed again of two gas types A and B, and, for example, the first cavities having a getter material in a quantity such that gas type A will be absorbed completely or nearly completely after getter activation, while the second cavities having a getter material which absorbs gas type A within the mixture of (A+B) to a different percentage than the first getter material, and while the third cavities having no getter material at all. Alternatively, the gas mixture may be composed of three or even more gas types A, B, C, . . . . In this case it is advantageous, to place a getter material having one first absorption characteristic with respect to the gas mixture within the first cavity, and another getter material having one second absorption characteristic with respect to the gas mixture within the second cavity. A gas mixture may be composed exemplary of gas types $CO_2$, $N_2$ and Ar. One getter material with one first absorption characteristic may absorb carbon dioxide, but not or only insignificantly absorb nitrogen. One getter material with one second absorption characteristic may absorb nitrogen and carbon dioxide. A third cavity may remain free of any getter material.

As has been indicated already, the production of MEMS components is preferably done as multiple components, for example, as wafers, with the wafer or other multiple component being individualized into single components (for example, chips). Alternatively, the components can obviously also be constructed using a single substrate (for example, a base chip), suitably chosen to carry the active structure(s), and one cap (for example, a cap chip) which simultaneously covers the at least two cavities 5, 6 and hermetically seals these from each other.

In the following, the method according to this invention will be illustrated by example, with reference to FIGS. 4A)-4C), with the production of a wafer having a plurality or multiplicity of sensors, and being subsequently individualized into MEMS components. It should be obvious that instead of a sensor, any other active structure needed for microsystem technology can be used, such as actuator, resonators, displays, digital micro-mirrors, bolometers, RF switches, and others.

Any sensor element can be used as the sensor, for example a rotary rate sensor (resonant sensor, gyroscope), an accelerometer, an absolute pressure sensor, or a similar sensor. It should be apparent that a component can be created directly as a single component rather than creating a multiple component which is then individualized. Finally it is again pointed out that instead of a wafer or a silicon wafer, any other materials suitable for the creation of MEMS-components can be used as substrate and cap material or structures, respectively.

The exemplary method is comprised of the following steps:

1) A cap wafer coated in selected regions with getter material is provided and aligned with a sensor wafer. Using a holding fixture, it is kept at a predetermined distance.

Figure 4:
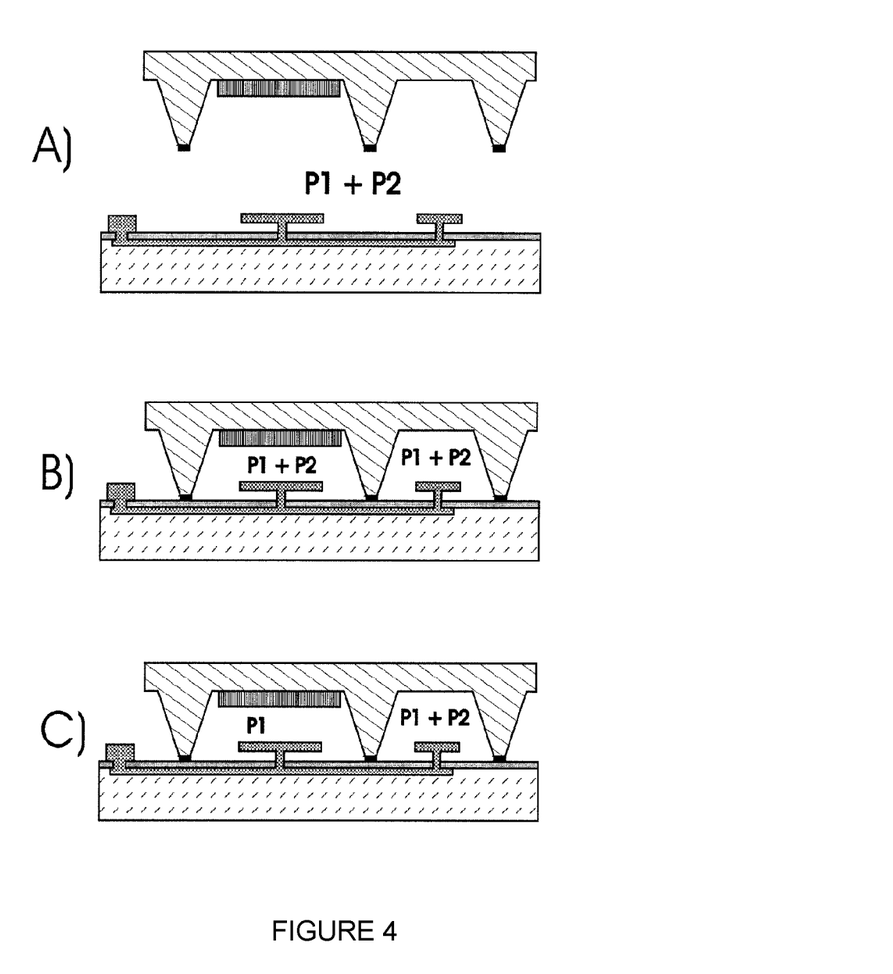
FIGS. 4A-4C illustrate a method in accordance with the present invention.

2) Either before or after the alignment, the wafer pair is placed into a production chamber (FIG. 4-A).

3) The production chamber is flooded with a production gas composed of an arbitrary mixture of gas types A and B (and if desired C and more), with partial pressures $P1$, $P2$, . .

., respectively. Gas type A can be absorbed by the getter material after the getter has been activated. In the example, gas type B is not gettered.

4) The cap wafer is lowered and is pressed against the sensor wafer (FIG. 4-B).

5) The bonding process is executed. Using eutectic bonding, for example, the cap wafer may carry a gold frame which has a contact area with the opposing wafer. Raising the temperature above the eutectic point will allow the formation of the liquid eutectic phase, consisting of 81 atom-% gold and 19 atom-% Si. The liquid phase hardens after cooling. The sensor wafer and the cap wafer are now solidly bound together with a gas tight bonding frame. An identical gas mixture is now enclosed in both cavities.

6) Using an appropriate getter activation process (FIG. 4-C), which is usually accomplished with a state of the art temperature treatment according to the manufacturers instructions, the getter material is modified such that it can absorb molecules of gas type A. This may also be accomplished during the bonding process. By activating the getter, gas type A is therefore evacuated from the cavities containing the getter material. Only gas molecules of gas type B remain. The original cavity pressure P1+P2 is reduced to remaining pressure P2. The original cavity pressure P1+P2 remains in those cavities not containing the getter material.

7) After processing of a multiple component is finished, the wafer is divided, e.g., cut into individual sensor systems (chips) containing the different subsystems.

In the following, the invention is described in more detail using examples of different gas mixtures.

Example A

The bonding chamber is primed with pure gas of type A (e.g., Nitrogen) at pressure P1.

In this example, consider a production gas at 4 mbar $N_2$ and 0.2 mbar Ar. In the chamber with Getter, there will be a total pressure after getter activation of 0.2 mbar, in the chamber without Getter the pressure will be 4.2 mbar.

In both cases, consideration has to be given to gas which enters the cavity through contamination, surface desorption and material outgassing. With respect to its absorption properties, this additional gas may be added to one of the two types of gas and its amount needs to be added, respectively.

The method according to this invention has several advantages:

1) A wide range of arbitrary, defined operating pressures can be selected due to the fact that compositions of gas of types A and B (and, if needed, C, . . . ) can be mixed in arbitrary quantities. Thus, first and second and, if needed third and more, cavities within the wafer or the MEMS component, respectively, can easily be provisioned with different gas pressures and/or different gas compositions. The necessity to have different pressures within different cavities has already been explained for a variety of components.

The ability to generate different gas compositions in first and second cavities can also be advantageous. For example, if the first cavity is coated with a material that will undergo an undesirable chemical reaction with a certain gas while one or the second cavity needs exactly this certain gas to achieve the effect of the active structure contained within the cavity, for example, in systems with optically active gases uses a blocking filter (measuring sensor and reference).

The integrated housing of two or more sensor types with different operating pressure onto a single wafer has the following advantages:

Achieving higher integration density. Individual processing of different sensor subsystems has to take into account peripheral areas, such as for a saw path, additional bonding pads, safety distances etc. These are not

|  | Chamber with Getter: | Chamber without Getter |
|---|---|---|
| Before Getter activation | Nitrogen with partial pressure P1<br>P = P1 | Nitrogen with partial pressure P1<br>P = P1 |
| After Getter activation | Nitrogen is bound to Getter | |
| Theoretical cavity pressure | P = 0 | P = P1 |
| Effectively achievable cavity pressure | P = 1E−6 bar<br>(Remaining pressure caused by contamination) | P = P1 +/− 1E−3 mbar |

Example B

The bonding chamber is primed with a gas mixture consisting of gas of type A (e.g., Nitrogen) at partial pressure P1, and gas of type B (e.g., Argon) at partial pressure P2.

needed with a combination design. This allows a considerably larger area to be used effectively.

Using lithographical methods, the alignment of different submodules is highly precise at the wafer level. A subsequent alignment of submodules is not necessary. Only the total system has to be aligned.

|  | Chamber with Getter: | Chamber without Getter |
|---|---|---|
| Before Getter activation | Nitrogen with partial pressure P1<br>Argon with partial pressure P2<br>P = P1 + P2 | Nitrogen with partial pressure P1<br>Argon with partial pressure P2<br>P = P1 + P2 |
| After Getter activation | Nitrogen is bound to Getter Argon remains | Nitrogen with partial pressure P1<br>Argon with partial pressure P2 |
| Theoretical cavity pressure | P = P2 | P = P1 + P2 |
| Effectively achievable cavity pressure | P = P2 +/− 1E−6 bar | P = P1 + P2 +/− 1E−6 mbar |

The invention claimed is:

1. A multiple component element intended to be subsequently individualized in order to form a plurality of components including active structures, said multiple component element comprising:
   a flat substrate and a flat cap structure that are connected to each other such that they define at least one first cavity and at least one second cavity therebetween for each of the plurality of components, wherein the first and second cavities for each of the plurality of components are sealed against each other and against their outside;
   at least one of a rotary rate sensor, accelerometer, actuator, resonator, display, digital micro-mirror, bolometer and RF-switch placed in the first cavity for each of the plurality of components; and
   a first getter material provided in the first cavity for each of the plurality of components so as to effect at least one of a different internal pressure and a different gas composition within the first and second cavities for each of the plurality of components.

2. The multiple component element of claim 1, wherein at least one of the flat substrate and the flat cap structure comprises a silicon wafer.

3. The multiple component element of claim 1, wherein an upper surface of the flat substrate is essentially flat with the exception of any contained active structure, and wherein the flat cap structure comprises internal recesses.

4. The multiple component element of claim 1, wherein the second cavity for each of the plurality of components does not contain any getter material.

5. The multiple component element of claim 1, wherein the second cavity for each of the plurality of components includes a second getter material having gas absorption characteristics that are different from as absorption characteristics of the first getter material.

6. The multiple component element of claim 1, wherein:
   the first and second cavities for each of the plurality of components are provided with the first getter material; and
   the getter material in the second cavities for each of the plurality of components has one of a smaller amount and a smaller area to volume ratio than the getter material in the first cavities.

7. The multiple component element of claim 1, wherein the first getter material is at least partly or regionally structured.

8. The multiple component element of claim 1, wherein the flat substrate and the flat cap structure are bonded to each other through a hermetically sealed bonding frame.

9. A flat substrate structure or a flat formed cap structure to be used in a multiple component element intended to be subsequently individualized in order to form components containing active structures, the flat substrate structure or cap structure comprising:
   first regions, recesses or depressions and second regions, recesses or depressions;
   at least one of a rotary rate sensor, accelerometer, actuator, resonator, display, digital micro-mirror, bolometer and a RF-switch for placement in each of the first regions, recesses, or depressions; and
   a first getter material for placement in each of the first regions, recesses or depressions wherein the second regions, recesses or depressions comprise one of no getter material and a second getter material with gas absorption characteristics different from those of the first getter material.

10. The component of claim 9, wherein the first and the second cavities are surrounded by a bonding frame.

11. A component for Microsystems technology comprising:
   a single substrate and a cap structure that are connected to each other such that they define at least one first cavity and at least one second cavity, the first and second cavity arc cavities being sealed against each other and against their outside;
   at least one of a rotary rate sensor, accelerometer, actuator, resonator, display, digital micro-mirror, bolometer and a RF-switch arranged in at least one first cavity; and
   a first getter material provided in at least one first cavity so as to effect a different internal pressure and a different gas composition within the first and second cavities.

12. The component of claim 11, wherein at least one of the single substrate and the cap structure comprises a silicon wafer.

13. The component of claim 11, wherein an upper external surface of the single substrate is essentially flat, with the exception of any contained active substances, and wherein the cap structure comprises internal recesses or depressions.

14. The component of claim 11, wherein the at least one second cavity does not contain any getter material.

15. The component of claim 11, wherein the at least one second cavity comprises a second getter material having gas absorption characteristics that are different from gas absorption characteristics of the first getter material.

16. The component of claim 11, wherein the at least one second cavity comprises the first getter material, wherein the getter material in the second cavity has at least one of a smaller amount and a smaller area to volume ratio than the getter material in the first cavity.

17. The component of claim 11, wherein the first getter material is at least partly or regionally structured.

18. The component of claim 11, wherein the single substrate and the cap structure are bonded to each other through a hermetically sealed bonding frame.

19. A single substrate or cap structure for a Microsystems technology component, comprising:
   a plurality of first recesses or depressions comprising a first getter material having a first gas absorption characteristic; and
   a plurality of second recesses or depressions comprising a second getter material having a second gas absorption characteristic, the second absorption characteristic being different from the first gas absorption characteristic.

20. The single substrate structure of claim 19, wherein the first plurality of recesses or depressions and the second plurality of recesses or depressions are surrounded by a bonding frame.

21. A method for producing a component comprising a substrate and a cap structure that are connected to each other such that they define therebetween at least one first cavity and at least one second cavity comprising the steps of:
   providing a flat substrate and a cap structure, one of which is coated with a first getter material in a location that will at least partially define the first cavity;
   aligning the substrate and the cap structure to form a paired substrate and cap structure;
   positioning the paired substrate and cap structure into a production chamber;
   flushing the production chamber with a production gas comprising at least a first gas that is absorbable by the first getter material;
   putting the cap structure and the substrate into contact with one another and bonding the cap structure and the substrate together; and activating the first getter material such that it absorbs molecules of the first gas.

22. The method of claim 21, further comprising individualizing the component into a multiplicity of individual components.

23. The method of claim 21, wherein bonding the cap structure and the substrate together is performed using a hermetical bonding.

24. The method of claim 21, wherein bonding the cap structure and the substrate together is performed during activating the first getter material.

25. The method of claim 21, wherein bonding the cap structure and the substrate is performed using eutectic bonding.

26. The method of claim 21, wherein at least one of the cap structure and the substrate is provided with a gold frame to be used for bonding the cap structure and the substrate together.

27. The method of claim 21, wherein flushing the production chamber further comprises flushing the production chamber with a production gas comprising a second gas that is one of not absorbable by the first getter material and absorbable to a lesser degree than the first gas by the first getter material.

28. The method of claim 27, wherein the ratio of partial pressures of the first gas and the second gas is between 1:95 and 95:1.

29. The method of claim 28, wherein the first gas comprises at least one of $H_2$, $O_2$, $CO_2$, methane and $N_2$ and wherein the second gas comprises at least one of helium, neon, argon, krypton and xenon.

30. The method of claim 21, wherein the second cavity of the component does not contain a getter material.

31. The method of claim 27, wherein the second cavity is provided with a second getter material with absorption characteristics different from those of the first getter material with respect to at least one of the first and second gases.

32. The method of claim 27, wherein the second cavity is provided with the first getter material in such an amount or area that after activating the first getter material there is a different partial pressure ratio between the second cavity and the first cavity.

33. The method of claim 21, wherein the substrate and the cap structure further define therebetween at least one third cavity that is not provided with a getter material.

34. The method of claim 27, wherein the substrate and the cap structure further define therebetween at least one third cavity, the at least one third cavity provided with one of:
  a second getter material with absorption characteristics different from those of the first getter material with respect to at least one of the first and second gases; and
  a third getter material with absorption characteristics different from those of the first getter material and the second getter material with respect to at least one of the first and second gases.

35. The method of claim 34, wherein the production gas comprises a third gas that is one of:
  not absorbable by the second or the third getter material; and
  absorbable to a lesser degree than the first gas by the first getter material.

36. The method of claim 21, wherein the component is a multiple component element.

* * * * *

UNITED STATES PATENT AND TRADEMARK OFFICE
CERTIFICATE OF CORRECTION

PATENT NO. : 8,546,928 B2  Page 1 of 1
APPLICATION NO. : 12/296189
DATED : October 1, 2013
INVENTOR(S) : Merz et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 533 days.

Signed and Sealed this
Fifteenth Day of September, 2015

Michelle K. Lee
*Director of the United States Patent and Trademark Office*